United States Patent
Kim et al.

(10) Patent No.: US 10,180,467 B2
(45) Date of Patent: Jan. 15, 2019

(54) APPARATUS FOR TESTING MAGNETIC FIELD SENSOR ON WAFER AND METHOD THEREOF

(71) Applicant: MagnaChip Semiconductor, Ltd., Cheongju-si (KR)

(72) Inventors: Dong Ho Kim, Cheongju-si (KR); Ki Seok Cho, Cheongju-si (KR)

(73) Assignee: Magnachip Semiconductor, Ltd., Cheungju-si (KR)

( * ) Notice: Subject to any disclaimer, the term of this patent is extended or adjusted under 35 U.S.C. 154(b) by 304 days.

(21) Appl. No.: 14/159,861

(22) Filed: Jan. 21, 2014

(65) Prior Publication Data

US 2015/0028855 A1    Jan. 29, 2015

(30) Foreign Application Priority Data

Jul. 29, 2013   (KR) .................. 10-2013-0089664

(51) Int. Cl.
| | | |
|---|---|---|
| *G01R 31/28* | (2006.01) | |
| *G01R 35/00* | (2006.01) | |
| *G01R 33/00* | (2006.01) | |
| *G01R 33/07* | (2006.01) | |
| *G01R 33/12* | (2006.01) | |
| *G01R 19/20* | (2006.01) | |

(52) U.S. Cl.
CPC ...... *G01R 33/0011* (2013.01); *G01R 33/0052* (2013.01)

(58) Field of Classification Search
CPC ............... G01R 31/2829; G01R 35/00; G01R 33/0035; G01R 33/07; G01R 33/12; G01R 19/20

USPC ..... 324/202, 212, 260, 262, 754.17, 754.29, 324/756.03, 529

See application file for complete search history.

(56) References Cited

U.S. PATENT DOCUMENTS

| | | | | |
|---|---|---|---|---|
| 6,750,644 | B1 * | 6/2004 | Berkcan ................ | G01R 33/02 324/117 R |
| 7,183,763 | B1 * | 2/2007 | Murata ............... | G01R 31/2886 324/212 |
| 7,345,470 | B2 * | 3/2008 | Suzuki ............... | G01R 31/2829 324/202 |
| 8,089,276 | B2 * | 1/2012 | Kentsch ................ | G01D 5/147 324/251 |
| 2004/0041560 | A1 * | 3/2004 | Walters ................. | G01N 27/82 324/238 |
| 2008/0074109 | A1 * | 3/2008 | Tsukada ................ | G01N 27/72 324/234 |
| 2009/0295380 | A1 * | 12/2009 | Motz .................... | G01R 33/072 324/251 |

(Continued)

FOREIGN PATENT DOCUMENTS

EP       2690450    *  1/2014  ............ G01R 15/18

OTHER PUBLICATIONS

Physicist Flux, https://physciantulk.wordpress.com/2015/09/02/magnetic-effects-of-current/.*
R, Nave- HyperPhysics: Electricity and Magnetism.*

*Primary Examiner* — Neel Shah
(74) *Attorney, Agent, or Firm* — NSIP Law

(57) ABSTRACT

An apparatus and a method for testing a magnetic field sensor are provided, in which the method includes arranging a coil for generating a magnetic field, applying the magnetic field to the magnetic field sensor using the coil, and detecting the magnetic field applied to the magnetic field sensor.

15 Claims, 6 Drawing Sheets

(56) References Cited

U.S. PATENT DOCUMENTS

| | | | |
|---|---|---|---|
| 2010/0117638 A1* | 5/2010 | Yamashita | G01R 33/07 324/233 |
| 2012/0210562 A1* | 8/2012 | Jones | G01R 33/0035 324/202 |
| 2013/0009659 A1* | 1/2013 | Liu | G01R 35/00 324/756.02 |
| 2013/0038321 A1* | 2/2013 | Suzuki | G01R 35/00 324/224 |
| 2013/0300401 A1* | 11/2013 | Krapf | G01V 3/107 324/201 |
| 2014/0028303 A1* | 1/2014 | Ostrogorska | G01R 19/20 324/244 |
| 2015/0028859 A1* | 1/2015 | May | G01B 7/14 324/207.15 |

* cited by examiner

DIRECTION OF
MAGNETIC
FIELD LINES

DIRECTION OF MAGNETIC FIELD LINES

APPARATUS FOR TESTING MAGNETIC FIELD SENSOR ON WAFER AND METHOD THEREOF

CROSS-REFERENCE TO RELATED APPLICATIONS

This application claims the benefit under 35 U.S.C. § 119(a) of Korean Patent Application No. 10-2013-0089664 filed on Jul. 29, 2013, in the Korean Intellectual Property Office, the entire disclosure of which is incorporated herein by reference for all purposes.

BACKGROUND

1. Field

The following description relates to a magnetic field sensor testing apparatus and a magnetic field sensor testing method.

2. Description of Related Art

A 'multi-axis magnetic field sensor' refers to a sensing device configured to perceive azimuth angle by detecting a magnetic field in an X, Y or Z axis (The 'multi-axis' as used herein may include two or three axes).

Typically, it is necessary to directly apply a magnetic field to the X, Y or Z axes which are to be sensed in order to test the multi-axis magnetic field sensor. It is thus necessary to prepare a coil such as an inductor to apply the magnetic field, after which electric current is flowed through the coil for the testing of the magnetic field sensor, while varying the magnetic field according to an intended magnitude.

Korean Patent Publication No. 10-2006-0060666 proposes an apparatus using a two-axis magnetic field sensor to solve problems associated with three-axis compass.

The multi-axis magnetic field sensor can be tested on a wafer or in a package.

To test a magnetic field sensor on a wafer, it is typically necessary to apply a uniform magnetic field to the multi axis directions of the wafer. Accordingly, coils are needed at the X, Y and Z axis directions, respectively. It is especially necessary to employ a larger coil than the wafer to test the Z-axis direction, and also necessary to apply a larger magnetic field because the range of sensing the magnetic field increases. However, such need for applying greater electricity to the coil typically causes problems.

Meanwhile, for testing a sensor in a package, a socket is generally used. Although this testing also requires coils respectively for the X, Y and Z axis directions, smaller coils than for testing on a wafer can be used. However, because it is necessary to place the magnetic field sensor in the package in a socket for testing purposes, separate devices are necessary. Further, because a plurality of magnetic field sensor chips are tested in a sequential order, testing typically takes a longer time and incurs greater costs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for testing a magnetic field sensor on a wafer includes arranging a coil configured to generate a magnetic field on the wafer; applying the magnetic field to the magnetic field sensor using the coil; and detecting the magnetic field applied to the magnetic field sensor.

The magnetic field sensor may be configured to detect a magnetic field having multi-axis components.

The coil may have a cross sectional area that is smaller than a cross sectional area of the wafer.

The method may further include arranging the magnetic field sensor inside an area of the coil and at a distance away from a center point of the coil.

The angle of incidence between magnetic field lines generated from the magnetic field and a surface of the magnetic field sensor may be less than 90 degrees.

In response to the magnetic field applied to the magnetic field sensor being separated into X, Y, and Z axis components, the X, Y, and Z axis components may have similar values.

The wafer may be formed on a probe card.

A needle may be connected to the probe card and positioned away from a center point of the coil to a side of the coil.

The method may further include arranging the magnetic field sensor outside an area of the coil.

The method may further include arranging the magnetic field sensor on any quadrant within the area of the coil except a center point of the coil.

The method may further include arranging a plurality of magnetic field sensors inside the area of the coil.

In another general aspect, an apparatus for testing a magnetic field sensor includes a wafer including a magnetic field sensor; and a ring-shaped coil configured to generate a magnetic field to the magnetic field sensor, wherein the magnetic field sensor is positioned a distance away from a center point of the coil.

The apparatus may further include a probe card comprising the ring shaped coil; and a needle connected to the probe card, wherein the needle connected to the probe card is positioned away from the center point of the coil to a side of the coil.

The magnetic field sensor may be arranged at a position away from a center point of the coil and to a side thereof.

The coil may have a cross sectional area that is smaller than a cross sectional area of the wafer.

An angle of incidence between magnetic field lines generated from the magnetic field and a surface of the magnetic field sensor may be less than 90 degrees.

In response to the magnetic field applied to the magnetic field sensor being separated into X, Y, and Z axis components, the X, Y, and Z axis components may have similar values.

The coil and the wafer may be parallel to each other.

The magnetic field sensor may be arranged on any quadrant within an area of the coil except a center point of the coil.

The apparatus may further include a plurality of magnetic field sensors arranged inside an area of the coil.

In another general aspect, a method for testing a multi-axis magnetic field sensor includes providing a coil configured to generate a magnetic field having multi-axis components; providing the multi-axis components of the magnetic field to the multi-axis magnetic field sensor; and detecting the multi-axis components of the magnetic field using the multi-axis magnetic field sensor.

Other features and aspects will be apparent from the following detailed description, the drawings, and the claims.

BRIEF DESCRIPTION OF THE DRAWINGS

FIGS. 1A, 1B, and 1C are diagrams illustrating an example of a magnetic field sensor to which only a perpendicularly-oriented magnetic field is applied, and a coil, in which FIG. 1A is a plan view, FIG. 1B is a vertical cross-section view, and FIG. 1C is a graphical representation of an axis component of the magnetic field lines.

FIGS. 2A, 2B, 2C, 2D, and 2E are diagrams illustrating an example of a magnetic field sensor on a wafer to which a three-axis magnetic field is applied, and a coil, provided to explain a method for testing a magnetic field sensor on a wafer, in which FIG. 2A is a plan view, FIG. 2B is a vertical cross-section view, FIG. 2C is an enlargement of an area surrounding a magnetic field sensor, FIG. 2D is a graphical representation of an axis component of a line of magnetic force on an XY coordinate system, and FIG. 2E is a graphical representation of an axis component of magnetic field lines on an XYZ plane coordinate system.

FIGS. 3A and 3B are diagrams illustrating an example of an apparatus for testing a magnetic field sensor on a wafer, in which FIG. 3A is a plan view and FIG. 3B is a cross-section view.

Figure 1A:
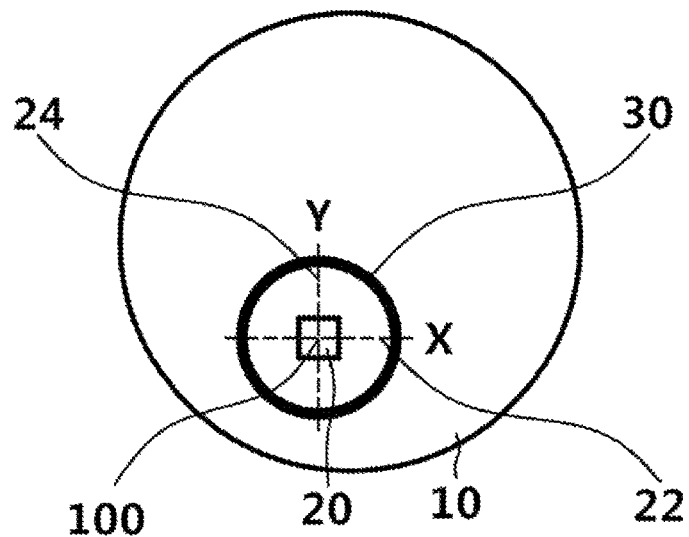

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1B:
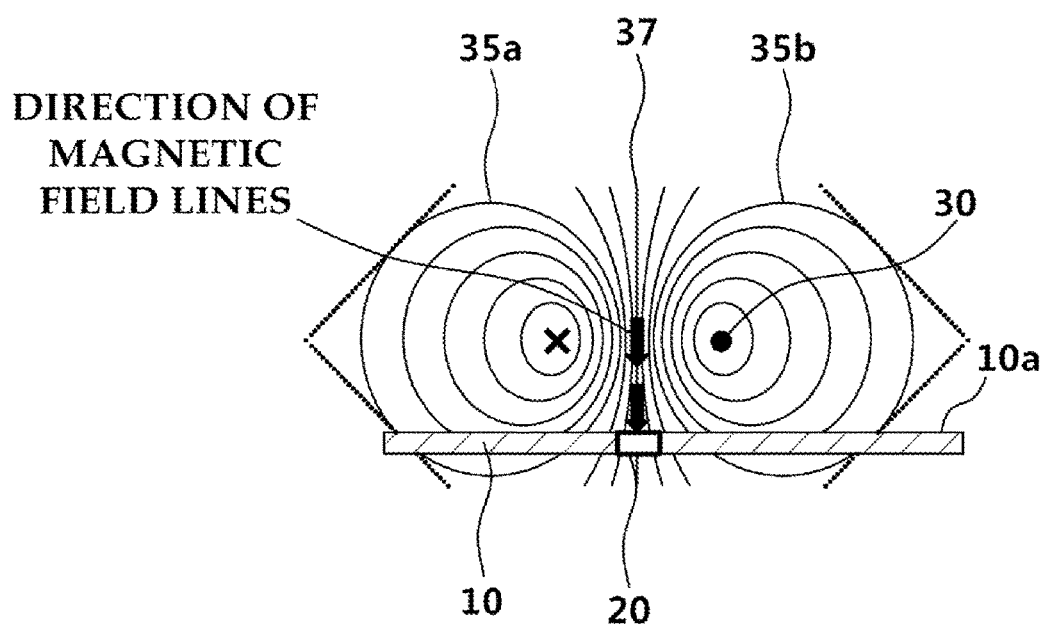
Figure 1C:
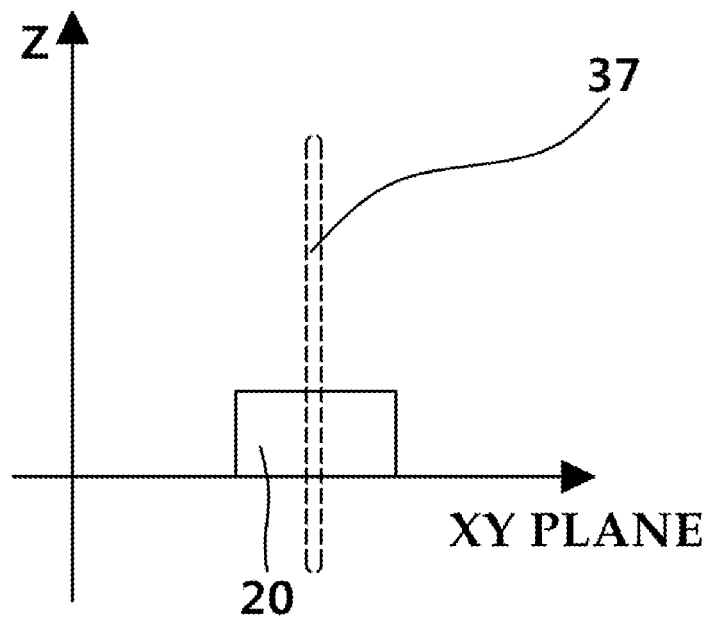

FIGS. 1A to 1C are diagrams illustrating an example of an arrangement of a magnetic field sensor to which only a perpendicularly-oriented magnetic field is applied, and a coil, in which FIG. 1A is a plan view, FIG. 1B is a vertical cross-section view, and FIG. 1C is a graphical representation of an axis component of magnetic field lines.

Referring to FIG. 1A, a ring-shaped coil 30 is arranged on a specific wafer 10 to be tested among a plurality of wafers. Accordingly, a magnetic field is generated at several angles including a perpendicular direction (Z axis) of the wafer 10 as the electric current flows through the coil 30. The size of the coil 30 may be smaller than that of the wafer 10. Further, the cross section occupied by the coil 30 may be smaller than that of the wafer 10. By doing so, a greater magnetic field is applied to the magnetic field sensor 20 to be tested.

A typical technique for testing a multi-axis magnetic field sensor involves mounting the coil for the purpose of self-testing inside the integrated circuit (IC). This technique, however, has a shortcoming of producing a limited strength of electric current on the coil because the coil is mounted within the IC. Accordingly, the coil cannot properly evaluate the performance of the IC. In an example, since the coil is mounted on test equipment instead of inside of the IC, a sufficiently large magnetic field is generated to provide accurate testing on the performance of the IC.

It should be appreciated that a magnetic field can be categorized into two types denoted by the symbols B and H. B is generally referred to as 'magnetic flux density' and H is referred to as 'magnetic field strength'. The term 'magnetic field' as used herein generally refers to the magnetic flux density, B.

Referring to FIG. 1A, a repeating alignment of numerous magnetic field sensors 20 may be on the wafer 10 for measuring. In FIG. 1A, a single magnetic field sensor 20 formed on the wafer 10 is illustrated as a representative example. For example, the magnetic field sensor 20 may refer to a Hall sensor which detects magnetic field strength. The Hall sensor may be designed to measure external magnetic field using the Hall effect.

Referring to FIG. 1A, because the greatest magnetic field strength is applied to the direction of the Z axis of the magnetic field sensor 20 to be tested, the magnetic field sensor 20 is arranged at a center point 100 of the ring-shaped coil 30.

Referring to FIG. 1B, a series of lines, i.e., magnetic field lines 35a, 35b, 37 are formed, representing the shape of the magnetic field. The direction of the magnetic field is identical to the direction of the tangent of the magnetic field lines, and the magnetic field strength is proportional to the density of the magnetic field lines. In the magnetic field sensor 20 which is on the wafer 10, the magnetic field lines 37 corresponding to the Z axis component, which are perpendicular with an upper surface 10a of the wafer 10 or to the surface of the magnetic field sensor 20, are those which contact the magnetic field sensor 20. The rest of the magnetic field lines 35a or 35b do not contact the magnetic field sensor 20.

Accordingly, referring to FIG. 1C, only the magnetic field lines 37 corresponding to the Z-axis component is applied to the magnetic field sensor 20. On the contrary, it is necessary to apply horizontally-oriented magnetic field components 22, 24 (X- or Y-axis) of the magnetic field sensor 20 through separate coils (not illustrated) to test the performance of the multi-axis magnetic field sensor 20.

Figure 2A:
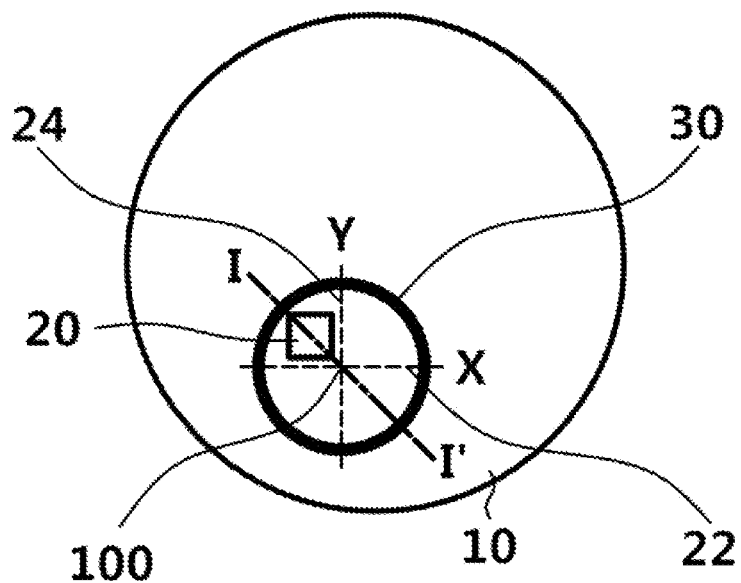
Figure 2B:
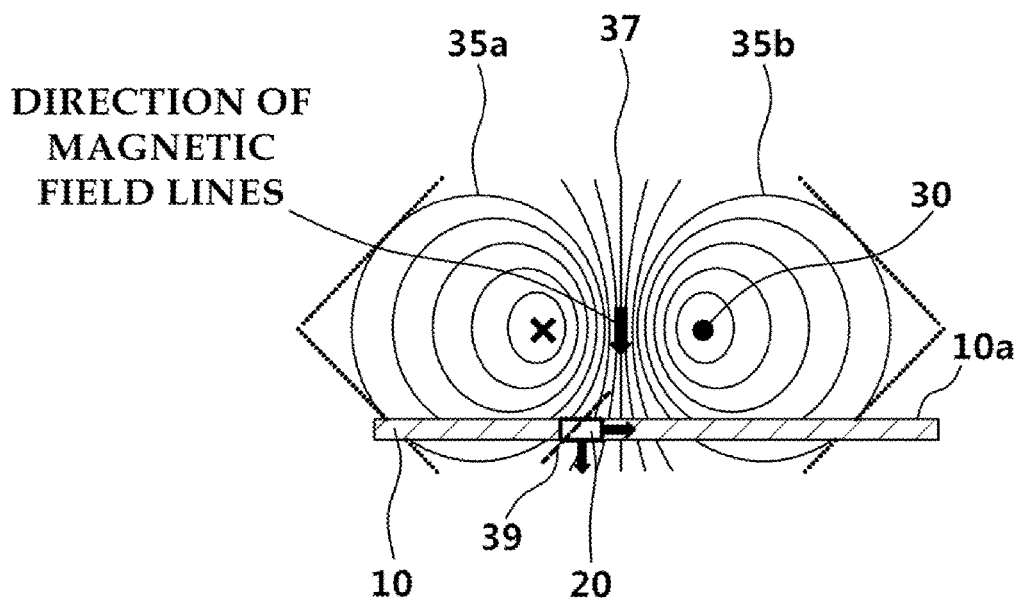
Figure 2C:
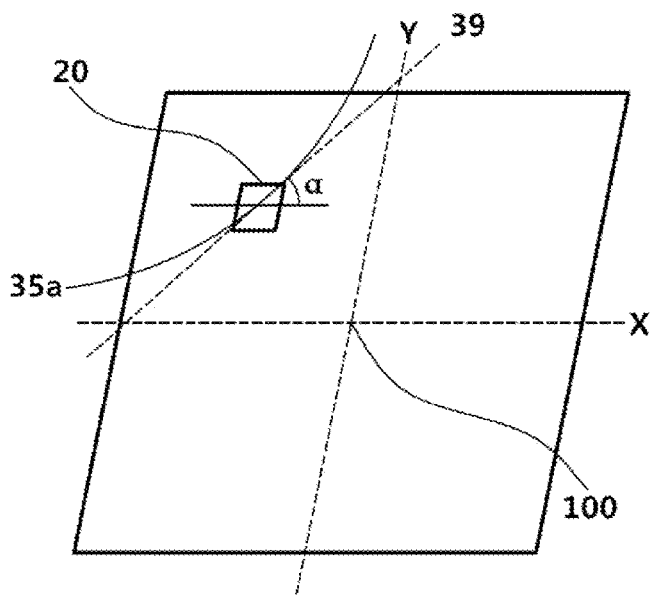
Figure 2D:
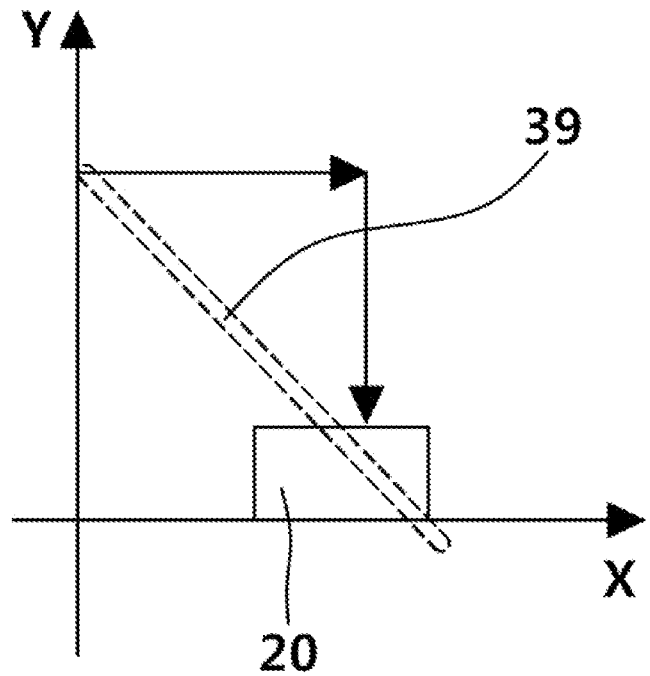
Figure 2E:
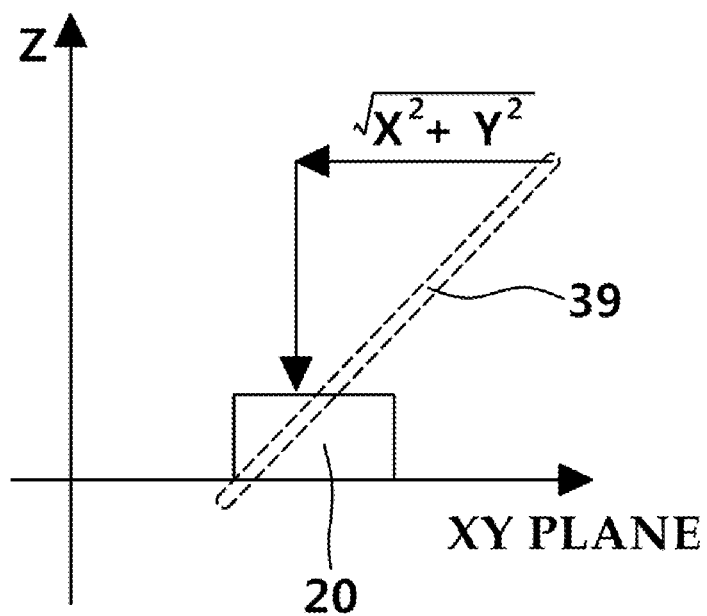

FIGS. 2A to 2E are diagrams illustrating examples of an arrangement of a magnetic field sensor on a wafer to which a three-axis magnetic field is applied, and a coil. FIGS. 2A to 2E also illustrate an example of a method for testing a magnetic field sensor on a wafer, in which FIG. 2A is a plan view, FIG. 2B is a vertical cross-section view, FIG. 2C is an enlargement of a magnetic field sensor, FIG. 2D is a graphical representation of an axis component of a line of magnetic force on an XY coordinate system, and FIG. 2E is a graphical representation of an axis component of magnetic field lines on an XYZ plane coordinate system.

Referring to FIG. 2A, an example of a method for testing a magnetic field sensor on a wafer utilizes the principle that magnetic fields 22, 24 in a vertical direction (Z) and horizontal directions (X, Y) of the wafer 10 can be generated with only one coil 30, i.e., without requiring separate coil to generate a magnetic field in a horizontal direction.

The magnetic field sensor 20 to be measured is arranged at a location other than the center point 100 of the coil, i.e., arranged away from the center point 100 of the coil 30. Accordingly, the magnetic field sensor 20 is located at a distance away from the center of the coil 30. For example, the magnetic field sensor 20 may be located anywhere within 0-360 degrees with respect to the X axis, and away from the center point 100.

The magnetic field sensor 20 may be positioned in the quadrant I, II, III or IV defined by the X and Y axes. That is, the magnetic field sensor 20 is arranged between the X and Y axes and not on the X or Y axis. For example, the magnetic field sensor 20 is at 45 degrees with reference to X axis when arranged on quadrant I, at 135 degrees when arranged on quadrant II, at 225 degrees when arranged on quadrant III or at 315 degrees when arranged on quadrant IV.

FIG. 2A is a diagram illustrating an example of including only one magnetic field sensor 20 in the coil region for convenience of explanation. Accordingly, in practical implementation, there may be other magnetic field sensors (not illustrated) around the magnetic field sensor 20. In an example where the magnetic field sensors 20 are arranged in the respective quadrants of the coil 30 region one by one, a total of four magnetic field sensors 20 may be arranged. In an example where four magnetic field sensors 20 are arranged in each of the quadrants, a total of sixteen magnetic field sensors may be arranged. A greater number of magnetic field sensors may further shorten the measuring time.

FIG. 2B is a diagram illustrating an example of a magnetic flux formed on the surface of the wafer 10, in a cross section cut along line I-I of FIG. 2A. Magnetic field lines 37 incident at a right angle with respect to the wafer surface 10*a* and magnetic field lines 35*a* incident at various angles may be present.

FIG. 2C is a diagram illustrating an example of an area surrounding the magnetic field sensor 20 in enlargement. When a tangent or diagonal line of the magnetic flux (e.g., 35*a*) is drawn through each point at which the magnetic flux and the wafer 10 or the surface of the magnetic field sensor 20 meet, slope 39 with several incident angles (a) are formed. The slope 39 is not parallel to the X-Y plane. The slope at which the greatest magnetic field strength exists is when the incident angle ($\alpha$) is 90 degrees. However, as illustrated in FIG. 2B, the magnetic field sensor 20 is at a distance away from the point at which the Z-axis magnetic field lines 37 is incident at 90 degrees on the upper surface 10*a* of the wafer. Accordingly, magnetic field lines with an incident angle less than 90 degrees (not 90 degrees) contact the magnetic field sensor 20.

This is because the magnetic field sensor 20 is arranged a distance away from the center point 100 of the coil 30. The distance the magnetic field sensor 20 is away from the center point 100 may vary depending on the distance between the coil 30 and the wafer 10. As the distance between the coil 30 and the wafer 10 decreases, the magnetic field sensor 20 is arranged as far away from the center point 100 as possible. For example, an incident angle ($\alpha$) of 45 degrees is preferred. That is, among the magnetic field lines 35*a*, 35*b*, and 37 that contact the magnetic field sensor 20, the magnetic field lines 35*a* are contacted with the wafer surface 10*a* at 45 degrees of incident angle ($\alpha$). In this way, the most ideal magnetic field strength can be applied, and the magnetic field components in the X, Y and Z axes may have similar strengths.

In this example, the magnetic field lines 37 have an incident angle of 90 degrees, but they do not contacted the magnetic field sensor 20. This is because the magnetic field sensor 20 is arranged at a location away from the center point 100 of the coil 30.

Referring to FIG. 2D, the magnetic field direction applied to the magnetic field sensor 20 has an incident angle of 45 degrees in the XY coordinate system. That is, the tangent angle is 45 degrees at a point at which the magnetic field lines 35*a* meets the wafer 10. The X- and Y-axis components become equal at 45 degrees. It is considered that the X- and Y-axis magnetic field components with the same strength influence the magnetic field sensor 20.

Referring to FIG. 2E, magnetic field components with slope 39 having an incident angle of 45 degrees is also formed on an XYZ coordinate system. In this example, when the magnetic field components are disintegrated into X-, Y- and Z-axis components, the X, Y and Z components are equal.

Accordingly, the magnitude of the vertically-oriented components Z are decreased relative to when the magnetic field sensor 20 is located at the center point 100 of the coil 30. However, the magnitude of the horizontally-oriented components (X, Y) is greatly increased. Accordingly, it is possible to apply a three-axis (X, Y, Z) magnetic field to the magnetic field sensor 20 on the wafer 10 using only one coil 30.

Figure 3A:
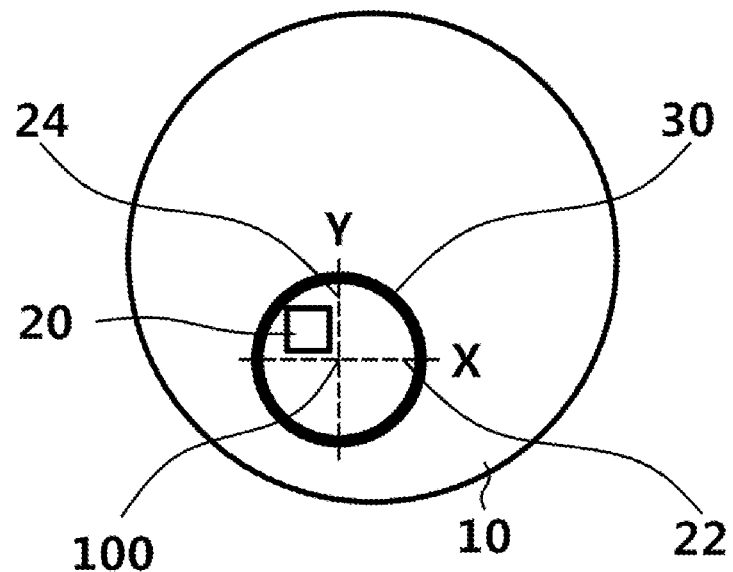
Figure 3B:
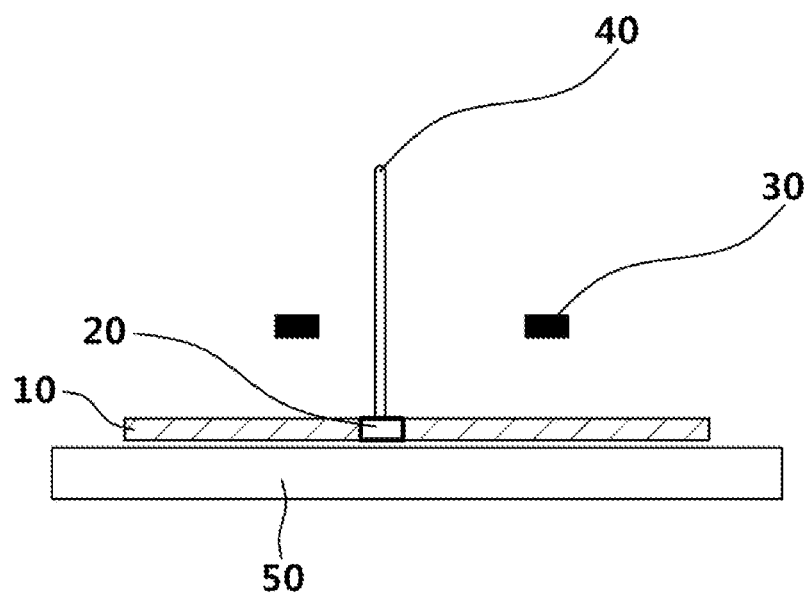

FIGS. 3A and 3B are diagrams illustrating an example of an apparatus for testing a magnetic field sensor on a wafer, in which FIG. 3A is a plan view and FIG. 3B is a cross-section view.

Referring to FIGS. 3A and 3B, an apparatus for testing a magnetic field senor on a wafer includes a ring-shaped coil 30 placed in a horizontal direction on the wafer 10 where the magnetic field sensor 20 is formed, and at such a location that the magnetic field sensor 20 is arranged a distance away from the center point. A needle 40 is in contact with an upper portion of the magnetic field sensor 20, and a probe card 50 is configured to apply a magnetic field to the magnetic field sensor 20 by feeding an electric current to the coil 30. The probe card 50 is also configured to detect a magnetic field with X-, Y- and Z-axis components by detecting the magnetic field applied to the magnetic field sensor 20.

As illustrated in FIGS. 3A and 3B, the needle 40, which is connected to the probe card 50, measures the magnetic field while being in contact with the magnetic field sensor 20. Accordingly, to ensure that the needle 40 is brought into direct contact with the magnetic field sensor 20, the needle 40 is deviated to a distance from the coil 30 to align the magnetic field sensor 20 directly above, instead of being arranged at the center point 100 of the coil 30. In order to arrange the magnetic field sensor 20 at a location other than the center point 100 of the coil 30 (left-upper side according to an example illustrated in FIG. 3A), it is preferred that the needle 40, which will be connected to the magnetic field sensor 20, is also arranged on the X, Y coordinates above the magnetic field sensor 20 on the left-upper side of the center point 100.

The probe card 50 is configured to connect a semiconductor chip to testing equipment to inspect operation of a semiconductor, in which a probe needle 40 mounted on the probe card 50 is brought into contact with the wafer 10 to supply electricity and screen defective semiconductor chips according to the returning signals.

Figure 4A:
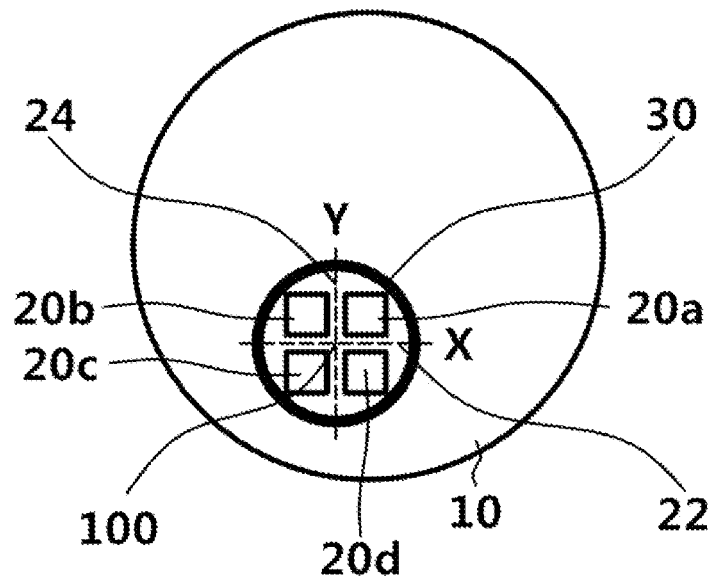
FIGS. 4A and 4B are diagrams illustrating an example of a method for testing a magnetic field sensor on a wafer.
Figure 4B:
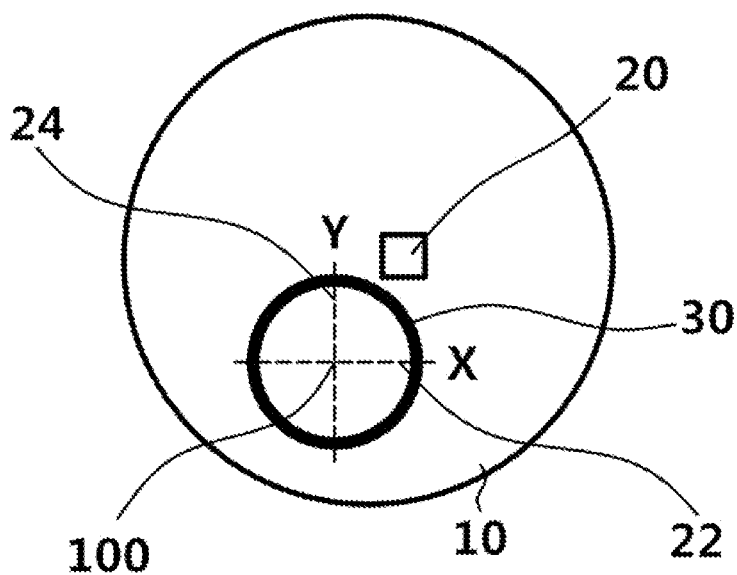

FIGS. 4A and 4B are diagrams illustrating an example of a method for testing a magnetic field sensor on a wafer.

As illustrated, it is possible to arrange four magnetic field sensors 20*a*, 20*b*, 20*c*, 20*d* for testing by arranging one in each of the quadrants of the coil 30 region, except the center point 100 of the coil 30. Also, it is possible to arrange up to 16 magnetic field sensors by arranging four in each of the quadrants. The more magnetic field sensors which are arranged, the shorter the time it takes for the measuring.

In another example, the magnetic field sensors may be arranged outside the coil 30 region. FIG. 4B illustrates the magnetic field sensor 20 arranged outside the coil 30 region at an upper-right direction. Even the location outside the coil 30 region can provide effective measuring. In an example, the magnetic field lines may be at a location that can form an incidence angle of 45 degrees with the magnetic field sensor 20 being contacted. At distances which are too far outside the coil, the magnetic field strength decreases and measuring may be difficult.

Accordingly, in various aspects, multi-axis magnetic field sensors are tested on a wafer, using a coil smaller in size than the cross section of the wafer. For example, with only one coil in a predetermined position, such as only one coil in a perpendicular direction (Z axis) with respect to the multi-axis magnetic field sensors, the magnetic fields in three axis directions including X or Y axis directions are detected. Accordingly, the number of coils and size thereof can be reduced, and electric current necessary for generating the magnetic field can also be reduced. As a result, the cost and time related to testing can be reduced.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for testing a magnetic field sensor on a wafer, the method comprising:
   arranging the magnetic field sensor inside a magnetic field of a coil having a radial direction parallel to a surface of the wafer,
   wherein the magnetic field sensor is arranged away from a center point of the coil by a distance,
   wherein the coil has a cross-sectional area smaller than a cross-sectional area of the wafer, and
   wherein the coil is configured to apply a three-axis magnetic field to the magnetic field sensor, and the distance corresponds to a distance between the coil and the wafer such that the magnetic field sensor contacts magnetic field lines generated from the three-axis magnetic field having an incident angle of approximately 45 degrees between a Z axis and an XY coordinate plane, at a point at which the magnetic field lines meet the surface of the wafer; and
   detecting the three-axis magnetic field applied to the magnetic field sensor,
   wherein the coil is a single coil used in applying the three-axis magnetic field to the magnetic field sensor, and
   wherein in response to the three-axis magnetic field applied to the magnetic field sensor being separated into X, Y, and Z axis components, the X, Y, and Z axis components have similar values.

2. The method of claim 1, wherein the wafer is formed on a probe card.

3. The method of claim 2, wherein a needle is connected to the probe card and is positioned away from the center point of the coil to a side of the coil.

4. The method of claim 1, further comprising arranging an additional magnetic field sensor outside an area of the coil.

5. The method of claim 1, further comprising arranging at least four magnetic field sensors including the magnetic field sensor inside the magnetic field of the coil by arranging one magnetic field sensor in each quadrant of the coil.

6. The method of claim 5, wherein the detecting further comprises detecting the three-axis magnetic field applied to each of the magnetic field sensors.

7. The method of claim 1, wherein an angle of incidence of a magnetic field line in the center of the coil is perpendicular to the surface of the wafer.

8. The method of claim 1, wherein the coil applies the three-axis magnetic field to the magnetic field sensor without requiring a separate coil to generate the X-axis direction and the Y-axis direction components of the three-axis magnetic field.

9. The method of claim 1, wherein the magnetic field sensor outputs a detected magnitude of an X-component, a Y-component, and a Z-component of the three-axis magnetic field applied by the coil.

10. The method of claim 1, wherein the three-axis magnetic field is detected with the magnetic field sensor within the area surrounded by the coil.

11. The method of claim 1, wherein the magnetic field sensor is arranged in an area of the wafer beneath an area surrounded by the coil.

12. The method of claim 1, wherein the distance corresponds to a distance between the coil and the wafer such that the magnetic field sensor contacts magnetic field lines generated from the three-axis magnetic field having an incident angle of approximately 45 degrees in the XY coordinate plane.

13. An apparatus for testing a magnetic field sensor, comprising:
   a wafer comprising at least four magnetic field sensors; and
   a ring-shaped coil having a radial direction parallel to surfaces of the magnetic field sensors,
   wherein the ring-shaped coil has a cross-sectional area smaller than a cross-sectional area of the wafer,
   wherein the magnetic field sensors are arranged inside a magnetic field of the ring-shaped coil by arranging a magnetic field sensor in each quadrant of a coil region of the ring-shaped coil for simultaneous testing,
   wherein the magnetic field sensors are each positioned away from a center point of the ring-shaped coil by a distance, such that the ring-shaped coil is configured to apply a three-axis magnetic field to the magnetic field sensors,
   wherein the ring-shaped coil is a single coil used in applying the three-axis magnetic field to the magnetic field sensor,
   wherein in response to the three-axis magnetic field applied to the magnetic field sensor being separated into X, Y, and Z axis components, the X, Y, and Z axis components have similar values, and
   wherein the distance corresponds to a distance between the coil and the wafer such that the magnetic field sensors contact magnetic field lines generated from the three-axis magnetic field having an incident angle of approximately 45 degrees between a Z-axis and an XY coordinate plane.

14. The apparatus of claim 13, further comprising:
   a probe card comprising the ring-shaped coil; and
   a needle connected to the probe card,
   wherein the needle connected to the probe card is positioned away from the center point of the ring-shaped coil to a side of the ring-shaped coil.

15. A method for testing multi-axis magnetic field sensors on a wafer, the method comprising:
   positioning the multi-axis magnetic field sensors inside a magnetic field of a coil having a radial direction parallel to a surface of the wafer and separated away from a center point of the coil by a distance, such that the coil is configured to apply a multi-axis magnetic field to the multi-axis magnetic field sensors, and a magnetic field sensor is arranged in each quadrant of the coil for testing; and detecting the multi-axis components of the multi-axis magnetic field using the multi-axis magnetic field sensors, wherein:

the coil has a cross-sectional area smaller than a cross-sectional area of the wafer, and the coil is a single coil used in applying a three-axis magnetic field to the magnetic field sensor, in response to the three-axis magnetic field applied to the magnetic field sensor being separated into X, Y, and Z axis components, the X, Y, and Z axis components have similar values, and the distance corresponds to a distance between the coil and the wafer such that the magnetic field sensors contact magnetic field lines generated from the three-axis magnetic field having an incident angle of approximately 45 degrees between a Z-axis and an XY coordinate plane.

\* \* \* \* \*